United States Patent [19]

Tokiwai et al.

[11] Patent Number: 4,553,030
[45] Date of Patent: Nov. 12, 1985

[54] METHOD FOR AUTOMATIC ANALYSIS OF ELECTRON BEAM DIFFRACTION PATTERN

[75] Inventors: Moriyasu Tokiwai, Komaeshi; Sakumi Moriguchi; Takao Shinkawa, both of Akishimashi, all of Japan

[73] Assignees: Jeol Ltd.; Central Research Institute of Electric Power Industry, both of Tokyo, Japan

[21] Appl. No.: 584,602

[22] Filed: Feb. 29, 1984

[30] Foreign Application Priority Data

Mar. 9, 1983 [JP] Japan ................................. 58-38622

[51] Int. Cl.[4] .......................................... G01N 23/00
[52] U.S. Cl. ...................................... 250/307; 250/311
[58] Field of Search ............... 250/306, 307, 311, 357, 250/252.1; 378/70, 71

[56] References Cited

U.S. PATENT DOCUMENTS

| | | | |
|---|---|---|---|
| 3,790,793 | 2/1974 | King | 250/307 |
| 4,376,891 | 3/1983 | Rauscher et al. | 250/311 |
| 4,480,188 | 10/1984 | de Azevedo | 250/311 |

Primary Examiner—Bruce C. Anderson
Attorney, Agent, or Firm—Webb, Burden, Robinson & Webb

[57] ABSTRACT

A video image of an electron diffraction pattern is digitized and captured as a two dimensional array of intensity values. From the array of intensity values, the frequency distribution of said intensity values is obtained. It is determined that the diffraction pattern is composed of only diffraction spots, only diffraction rings, or both diffraction spots and rings by analyzing said frequency distribution. The diffraction pattern is thus analyzed easily and automatically.

5 Claims, 21 Drawing Figures

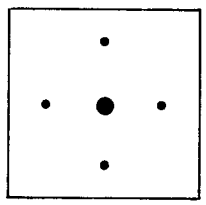
Fig. 1a
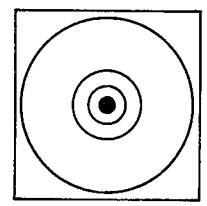
Fig. 1b
Fig. 1c
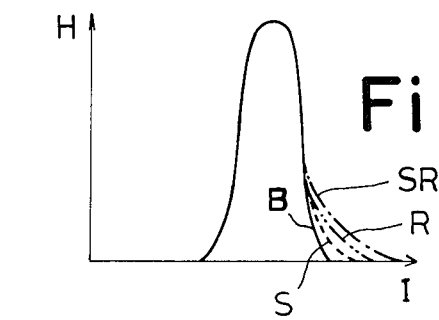
Fig. 2
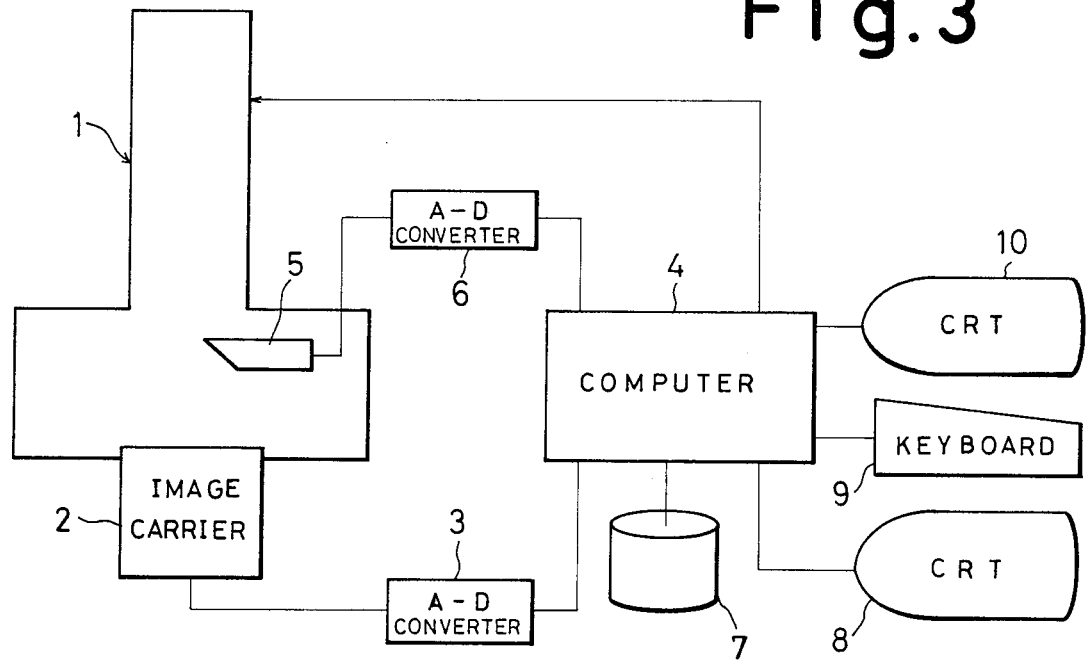
Fig. 3

Fig. 9
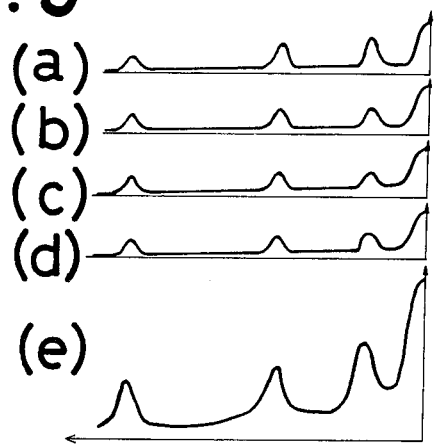
Fig. 11
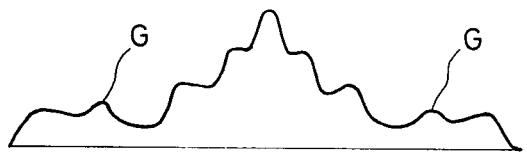
Fig. 13(a)   Fig. 13(b)

Fig.12(a)

| |
|---|
| $(hkl)_{s-1}$ |
| $(hkl)_s$ |
| MATERIAL NAME |
| CRYSTAL SYSTEM |
| $a_0$ |
| $b_0$ |
| $c_0$ |
| $d_1$ |
| $d_2$ |
| ∫ |
| $d_n$ |
| $(hkl)_1$ |
| $(hkl)_2$ |
| ∫ |
| $(hkl)_n$ |
| MATERIAL NAME |
| CRYSTAL SYSTEM |
| $a_0$ |
| $b_0$ |
| $c_0$ |
| $d_1$ |
| $d_2$ |
| ∫ |
| $d_m$ |
| $(hkl)_1$ |
| $(hkl)_2$ |
| ∫ |

ADDRESS $m$ → (points to $a_0$ row of first block)

ADDRESS $m+1$ → (points to MATERIAL NAME row of second block)

Fig.12(b)

| | |
|---|---|
| 0.01 | (d-VALUE) |
| m | } ADDRESS |
| l | |
| 0.02 | (d-VALUE) |
| m | } ADDRESS |
| t | |
| s | |
| 0.03 | (d-VALUE) |
| u | } ADDRESS |
| v | |

METHOD FOR AUTOMATIC ANALYSIS OF ELECTRON BEAM DIFFRACTION PATTERN

BACKGROUND OF THE INVENTION

This invention relates to a method for automatic analysis of electron beam diffraction pattern in a transmission electron microscope.

A transmission electron microscope capable of displaying electron beam diffraction pattern is very useful for investigation of a crystalline specimen. An electron beam diffraction pattern contains information on the crystal structure of the specimen, its orientation and many others. Analysis of the diffraction pattern, therefore, makes it possible to precisely analyze the crystal structure of the specimen, to identify the specimen materials, and to determine the orientations. The conventional analysis procedures for electron beam diffraction patterns are carried out as follows. First, the diffraction pattern displayed on the diffraction pattern forming plane or on the screen of a cathode-ray tube (CRT) is photographed on a film, and the film is developed in a darkroom. Then, the position of each diffraction spot or radius of each ring in the diffraction pattern on the developed negative film is measured so as to calculate the d-values (i.e., lattice spacing) of the crystal. The calculated d-values are collated with the many cards (or a data table) recording the d-values corresponding to the various materials, so as to select the one card which closely coincides with the obtained set of d-values of the unknown crystalline material. As a result, the specimen material is identified, and orientation of the crystalline specimen is decided. These analysis procedures, however, required troublesome manual operation such as photographic processing in a darkroom. In addition, specialized knowledge about analysis of crystal structure is required.

SUMMARY OF THE INVENTION

The main object of the invention is to provide a method for automatic analysis of a diffraction pattern in a transmission electron microscope.

This invention is based on the following consideration for the characteristics of the electron beam diffraction pattern.

The electron beam diffraction pattern may present a spot- or ring-shaped appearance as shown in FIGS. 1(a) and (b), or a mixed appearance of both as shown in FIG. 1(c). The image processing for each appearance is different from each other. Accordingly, for automatic analysis of the diffraction pattern, it is necessary to decide on the appearance of the pattern on the basis of the results of image processing, whereas the appearance of the pattern to be analyzed is easily decided on by a glance at manual analysis.

In automatic anaylsis of the diffraction pattern according to this invention, the pattern forming plane is divided into may pixels (picture elements) and the electron beam intensity "I" at each pixel is measured and stored (together with the address of the pixel) in a frame memory forming part of internal memory means of the computer 4. In the graph shown in FIG. 2, the abscissa indicates the electron beam (or detected signal) intensity "I", and the ordinate indicates the frequency distribution H(I) respectively, where the frequency distribution (or histogram function) H(I) means the number of pixels having the same intensity "I". The curves "S", "R" and "SR" in FIG. 2 indicate the spot-shaped appearance, ring-shaped appearance and mixed appearance respectively, and the curve "B" indicates the background component of the three curves "S", "R" and "SR". It is apparent from FIG. 2 that the ratio of the number of pixels having high electron beam intensity to the total number of pixels corresponding to each appearance of the pattern is different with respect to each other. Accordingly, it is possible to decide on the appearance of the pattern on the basis of the difference in the frequency distribution "H" at the high electron beam intensity "I". For example, the $\delta$-value indicated by the following equation (1) is calculated for a value indicating the shape of the frequency distribution curve, particularly in high electron beam intensity, as shown in FIG. 2

$$\delta = H(I) \cdot (I - \bar{I})^2 \quad (1)$$

where "$\bar{I}$" is the weighted average indicated by the following equation (2).

$$\bar{I} = \{\Sigma H(I)\} \cdot I / \}\Sigma H(I)\} \quad (2)$$

And the appearance of the analyzed diffraction pattern is decided according to a predetermined value range, to which the calculated $\delta$-value belongs. Furthermore, it is possible to change term $(I = \bar{I})^2$ in equation (1) to term $(I - \bar{I})^3$.

Automatic analysis of the invention based on the above mentioned consideration comprises the following steps:

(a) A step for converting an electron beam diffraction pattern to a distribution data of electron beam intensity at each one of the pixels on which the diffraction pattern is formed, (b) A step for measuring frequency distribution of said electron beam intensity from said distribution data, (c) A step for deciding whether said diffraction pattern is composed of only diffraction spots, only diffraction rings, or diffraction spots and rings, on the basis of the data processing using said frequency distribution of said electron beam intensity, (d) A step for accumulating the lattice spacing d-value corresponding to each diffraction spot or ring appearing in a distribution data of electron beam intensity, and (e) A step for determining the specimen material corresponding to said diffraction pattern by collating said lattice spacing d-values with the d-values of the various materials in a crystal database.

BRIEF DESCRIPTION OF THE DRAWINGS

FIG. 1(a–c) a schematic drawings showing the three appearances of the electron beam diffraction patterns, FIG. 2 is a graph showing the frequency distribution curve of the intensity at each one of the pixels on which an electron diffraction pattern is formed, FIG. 3 is a schematic drawing showing one embodiment for carrying out the automatic analysis of the diffraction pattern according to this invention.

DETAILED DESCRIPTION OF THE INVENTION

Figure 4:
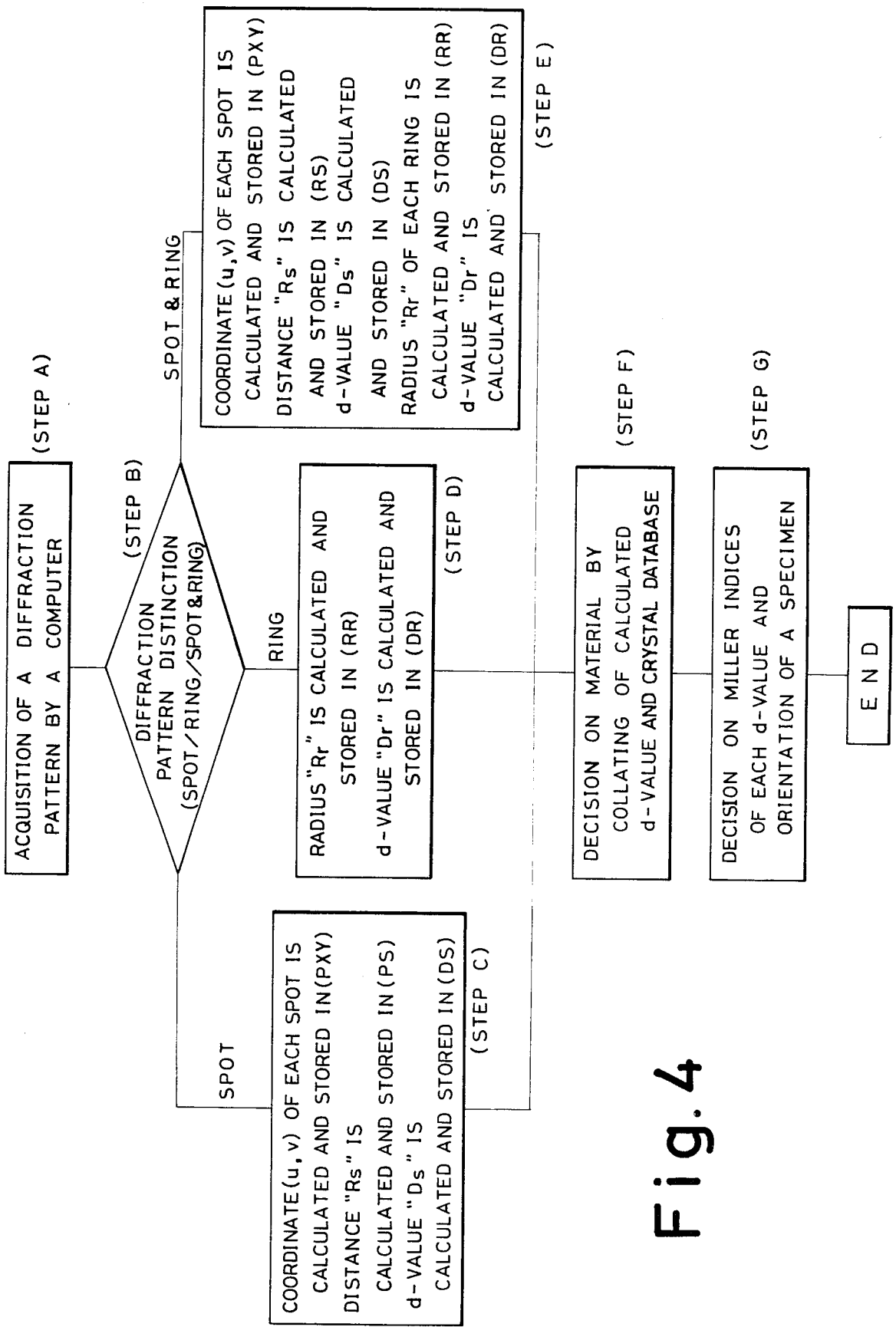
FIGS. 4, 5, 6, 7, and 10 are the flow charts for carrying out the automatic analysis according to this invention, FIGS. 8, 9 (a–c) and 11 are schematic diagrams showing X or Y axis projection curves of the frequency distribution, FIGS. 12(a–b) are a schematic diagrams for explaining the memorized crystal database, and FIGS. 13(a-b) a schematic drawings showing the screen of a CRT for data display.

FIG. 3 schematically shows a device for automatic analysis of the diffraction pattern according to the invention. In FIG. 3, a transmission electron microscope 1 is controlled by a computer 4 so that an observation mode for conventional transmission diffraction pattern or an observation mode for scanning transmission diffraction pattern is changed. In the mode for the conventional transmission diffraction pattern, the image carrier 2 incorporating an image pickup tube attached under a camera chamber of the electron microscope converts the electron beam diffraction pattern to an analong scanning video signal. This analog scanning video signal is converted to a digital video signal by an A-D converter 3, and is fed to the computer 4. And, in the mode for the scanning transmission diffraction pattern, a detector 5 is shifted to the optical axis of the electron microscope so as to detect the electron beam through a specimen which is scanned with the finely focussed electron beam from a scanning means. The analog scanning video signal output of the detector 5 is converted to the digital video signal by an A-D converter 6, and is fed to the computer 4. The computer 4 is connected to a CRT 8 for monitoring the diffraction pattern, a CRT 10 for displaying various information, a keyboard 9, and an external memory means 7 for storing crystal database and other information.

The analyzing process using the device shown in FIG. 3 is as follows.

First, an operator gives the computer 4 an order for observation mode of the conventional transmission diffraction pattern by means of the keyboard 9 so that the diffraction pattern is formed on the image carrier 2. Or an operator gives the computer 4 an order for observation mode of the scanning diffraction pattern by means of keyboard 9, so that the computer 4 controls the scanning signals for scanning the electron beam over a specimen and the detector 5 is shifted to the optical axis of the electron microscope 1. Then, the operator gives the computer 4 an order for starting the automatic analysis of the diffraction pattern via keyboard 9, so that data processing for analyzing the diffraction pattern is carried out according to the flow chart shown in FIG. 4 in the computer 4.

In step A of FIG. 4, the video signals from the image carrier 2 or from the detector 5 is digitized to provide a two dimensional array of digitized values in which video signal intensity corresponding to electron beam intensity is converted to one of the 356 levels. The analog output of the image carrier 2 is digitized in A-D converter 3 and the analog output of detector 5 is digitized in A-D converter 6. The computer 4 inputs the digitized data and constructs the two dimensional arrays. In the computer 4, the acquired (electron beam diffraction) pattern is stored (as the array of intensity values) in the internal (main) memory means in a location designated the frame memory. The frame memory is provided with a capacity of 512×512 bytes or words (each corresponding to a video pixel (picture element)) and each having one of 256 values corresponding to 256 gray levels.

Figure 5:
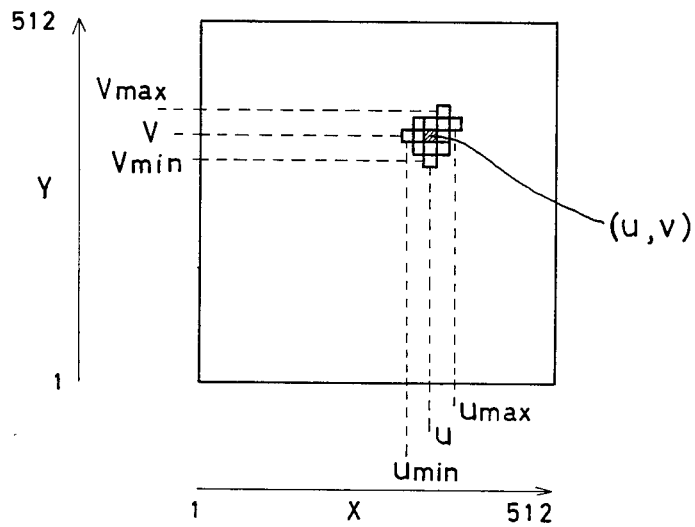

In step B, the computer decides on the appearance of the pattern by data processing the above stored video signals. FIG. 5 shows the pixels arranged in XY coordinates. Intensity of each pixel is indicated by Uxy, where x is the X axis value of the pixel and y is the Y axis value of the pixel. The computer 4 counts pixel satisfying Uxy=I at every level of "I", where "I" means a certain level value of 256 levels, so that the frequency distribution H(I) is obtained. Next, the computer 4 calculates the weighted average Ī indicates by the equation (2) using the frequency distribution H(I), and then calculated δ-values indicated by the equation (1). The computer 4 considers that the stored video signal is the spot-shaped appearance of the diffraction pattern at the case I in which δ-value is less than 88,000, and considers that the stored video signal is the ring-shaped appearance of the diffraction pattern at the case II in which δ-value is more than 105,000, and considers that the stored video signal is the spot- and the ring-shaped appearance of the diffraction pattern at the case III in which δ-value is between 88,000 and 105,000.

It is also possible to determine whether said diffraction pattern is composed of only diffraction spots, only diffraction rings, or with diffraction spots and rings, without calculation of equations (1) and (2). For example, it is possible to carry out said determination by measuring the inclination of the frequency distribution curve as shown in FIG. 2.

Figure 6:
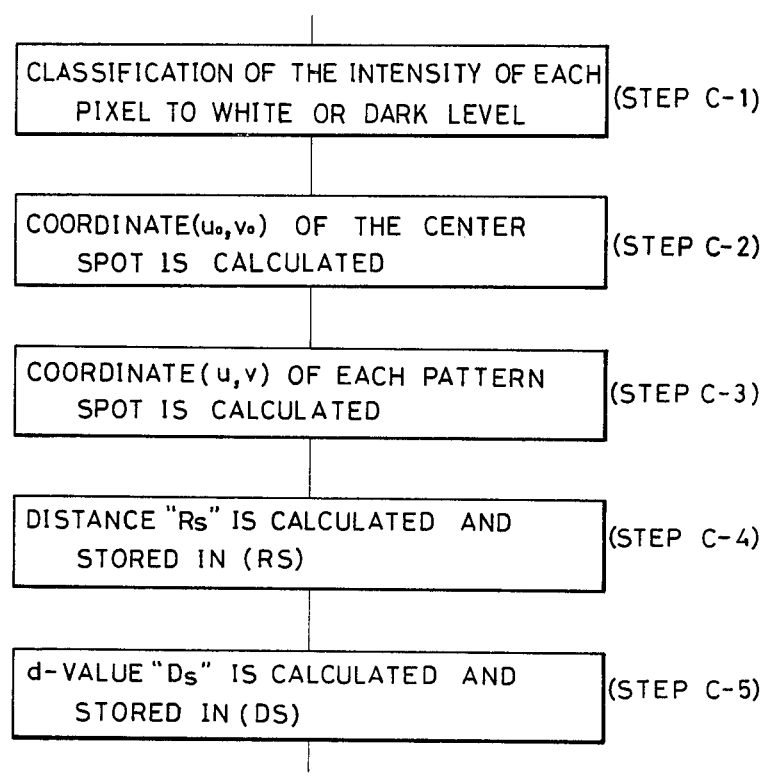

If the computer 4 considers that the stored video signal is the spot-shaped appearance of the diffraction pattern in step B, the step C comprising steps C1~C5 shown in FIG. 6 is carried out in order.

In step C-1, each Uxy is classified as being into either one of the two levels. Namely, one is the white level in which the value of Uxy is below a certain value, and the other is the black level in which the value of Uxy is more than the certain value. By this classification, several groups of white level pixels appear.

In step C-2, the computer 4 considers that the group having the most number of pixel among the said groups of white level pixels is a center spot, which corresponds to the position irradiated by the electron beam passing through the specimen without any diffraction. And the computer 4 calculates the (center) coordinate $(u_o, v_o)$ of the center spot according to the following equations (3-1) and (3-2).

$$u_o = (umax + umin)/2 \qquad (3\text{-}1)$$

$$v_o = (vmax + vmin)/2 \qquad (3\text{-}2)$$

Where, umax and umim indicate the maximum and minimum X-axis values of the pixels in the group considered as the center spot.

In step C-3, the computer 4 calculates the coordinate (u, v) of each group of the white level pixels except the group considered as the center spot according to the equations similar to said equations (3-1) and (3-2), and stores the coordinates (u, v) in the area (PXY) within the internal memory of the computer 4.

In step C-4, distance "Rs" between the center spot (u, v) and each one of the other spots (u, v) is calculated according to the following equation (4), and is stored in the area (RS) within the internal memory of the computer 4.

$$R_s = (u - u_o)^2 + (v - v_o)^2 \qquad (4)$$

Incidentally, some spots are in symmetry with respect to the center spot. The distances "Rs" referring to these spots are theoretically the same. And, in this step, it is considered that distances "Rs" within 5% differences with respect to each other are the sum value of the certain value and various errors in measurement, so that the mean value of these distance values within 5% differences is calculated and stored as said certain (or common) distance "Rs".

In step C-5, the lattice spacing d-valves "Ds" corresponding to the above calculated distances "Rs" are calculated according to the following equation (5), and are stored in the area (DS) within the internal memory of the computer 4.

$$D_s = (L \cdot \lambda)/R_s \quad (5)$$

Where, (L·λ) is a camera constant, which is varied according to the operation condition of the electron microscope. So, it is necessary to correct the camera constant according to the data obtained by the measurement using a standard crystalline specimen in every diffraction pattern analysis.

Figure 7:
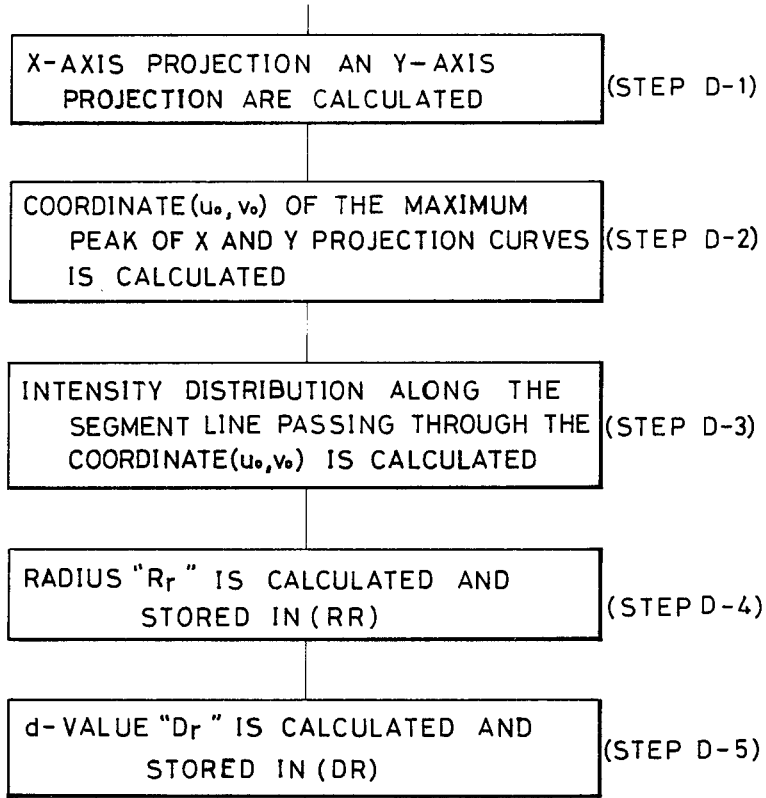

If the computer 4 considers that the stored video signal is the ring-shaped appearance of the diffraction pattern in step B, step D comprising steps D1~D5 shown in FIG. 7 is carried out in order.

Figure 8:
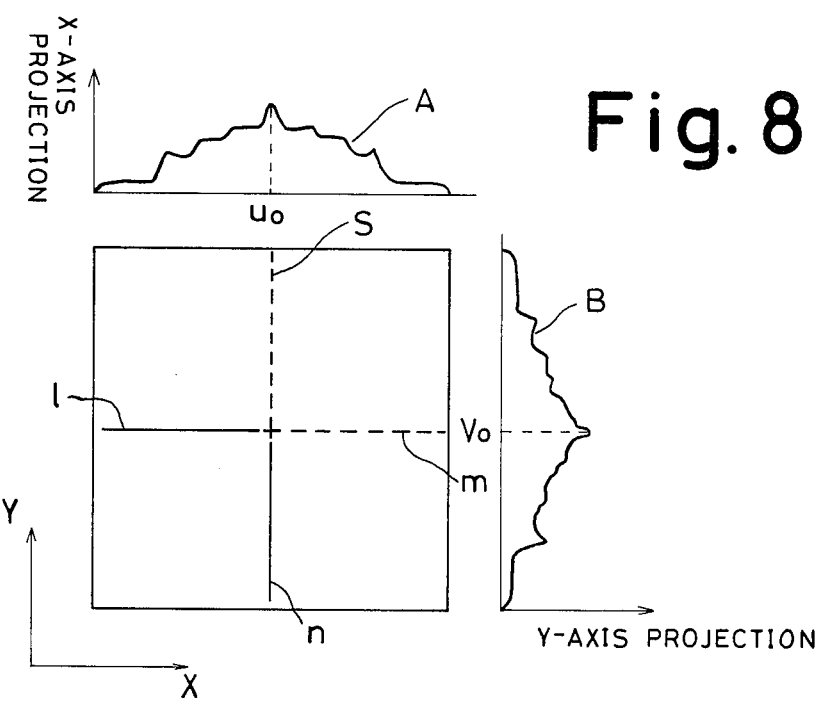

In step D-1, the X-axis projection of Uxy and Y-axis projection of Uxy are calculated. These projections corresponding to the ring-shaped diffraction pattern in FIG. 8 is shown by curves A and B.

In step D-2, the coordinate of the center spot($u_o$, $v_o$) in the ring-shaped diffraction pattern is determined by detecting the coordinate ($u_o$) at the maximum value of curve A and the coordinate ($v_o$) at the maximum value of the curve B.

In step D-3, Uxy on the segments "l" and "m" of the line passing through the center spot and parallel to the X-axis and Uxy on the segments "n" and "s" of the line passing through the center spot and parallel to the Y-axis are read out from the stored data. The Uxy data for each of the four segments are shown grapically in (a), (b), (c) and (d) of FIG. 9. In FIG. 9, the abscissa indicates the distance "r" between the center spot of the pattern and the pixel, and the ordinate indicates the electron intensity at each pixel. The Uxy data for each of the four segments are added to each other. The sum is shown graphically in FIG. 9(e).

In step D-4, the distance "Rr" between the center spot of the pattern and each local peak on the data curve shown in FIG. 9(e) is calculated so as to use the distance "Rr" as a radius of each diffraction ring of the pattern. The determined distance value "Rr" is stored in the area (RR) within the internal memory of the computer 4.

In step D-5, the lattice spacing d-values "Dr" corresponding to the above calculated radius "Rr" are calculated according to the following equation (5)' similar to the equation (5), and are stored in the area (RR) within the internal memory of the computer 4.

$$Dr = (L \cdot \lambda)/Rr \quad (5)'$$

Figure 10:
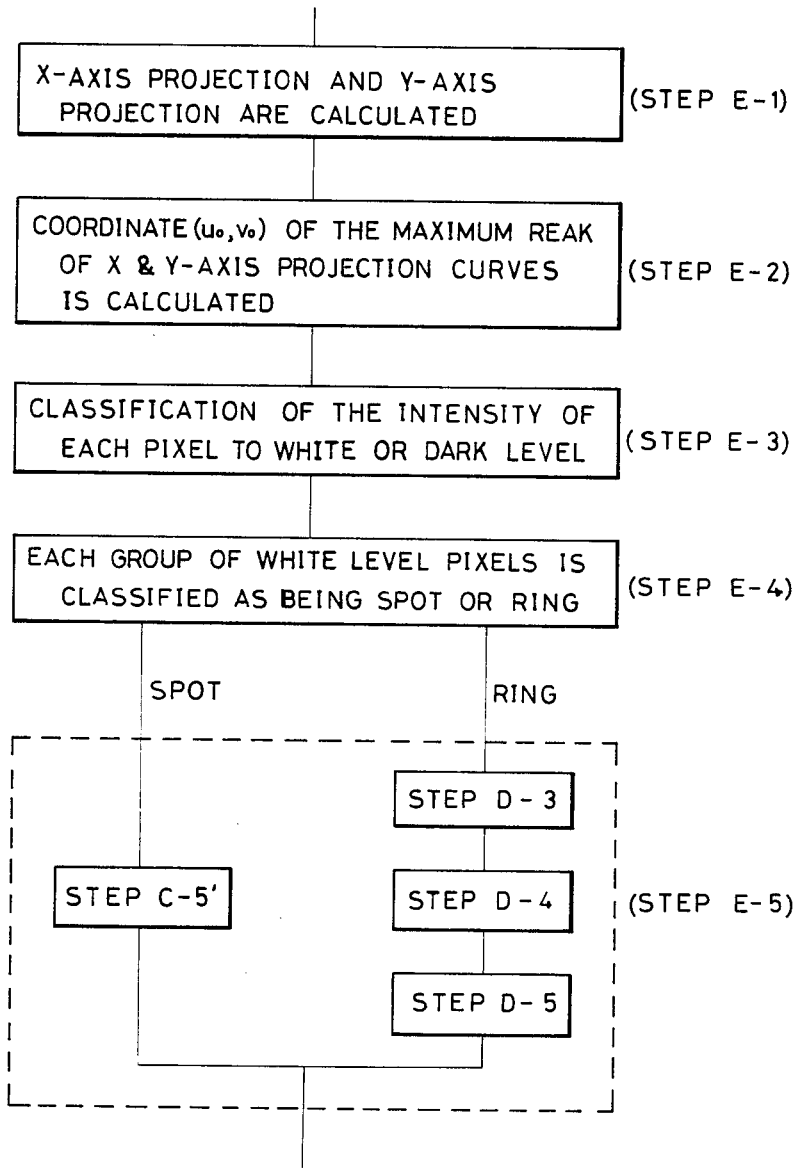

If the computer 4 considers that the stored signal is the spot- and ring-shaped appearance of the diffraction pattern in step B, step E comprising steps E1~E5 shown in FIG. 10 is carried out in order.

In step E-1, the X-axis projection of Uxy and Y-axis projection of Uxy are calculated the same as in the step D-1. These curves are shown in FIG. 11. In FIG. 11, local maximum peaks G appear due to the diffraction spots in the diffraction pattern. However, the heights of the peaks "G" are negligible in comparison with the heights of the peaks due to the diffraction rings.

In step E-2, the coordinate value of the center spot ($u_o$, $v_o$) in the diffraction pattern is determined by detecting the coordinate values ($u_o$) and ($v_o$) at the maximum values of said two projection curves.

In step E-3, each Uxy is classified as being either one of the two levels same as in step C-1. Namely, one is the white level in which the value of Uxy is below a certain value, and another is the black level in which the value of Yxy is more than the certain value. By this processing, several groups of the white level pixels appear.

In step E-4, the (center) coordinate value (u, v) of each said group of pixels is calculated. And the distance "R" between the center spot coordinate value ($u_o$, $v_o$) and other center coordinate value (u,v) is calculated according to said equation (4). The calculated distance "R" is compared with respect to some small value "$r_c$". And then, the group of the white level pixels is distinguished into a diffraction spot in the case that the equation of $R \geq r_c$ is satisfied, and the group of the pixels is distinguished into diffraction ring in the case that equation of $R < r_c$ is satisfied. By this processing, said each group of the pixels is distinguished into a diffraction spot or diffraction ring.

If the diffraction ring is processed as a diffraction spot, a vast number of very large d-values must be calculated. Accordingly, this step E-2 for paid and correct analysis of the diffraction pattern is necessary.

In step E-5, data of the groups of the white level pixels considered as a diffraction spot are processed only by step C-5' similar to said step C-5 forming part of said step C for a diffraction spot, because the distances "R" as distances "Rs" and the center coordinate values (u, v) are already obtained. And in step C-5', the lattice spacing d-values "Ds" corresponding to the said distances "Rs" are calculated, and the d-values "Ds", the distances "Rs" and the center coordinate values (u, v) are stored in the areas (DS), (RS) and (PXY) within the internal memory of the computer 4. On the other hand, other groups of pixel data distinguished into diffraction ring are processed by said steps D-3, D-4, and D-5 in that order. And the calculated distance values "Rr" and their corresponding lattice spacing d-values "Dr" are stored in the areas (RR) and (DR) within the internal memory of the computer 4.

In step F, the d-values stored in said internal memory of the computer 4 are collated with the crystal database stored in the external memory means 7. The crystal database consists of many data units consisting of the material name, its crystal system (for example, cubic, hexagonal, . . . ), lattice constant $a_o$, $b_o$ and $c_o$, plural d-values, d1, d2, . . . , dn and Miller indices (h, k, l), (h, k, l), . . . as shown in FIG. 12(a). In order to achieve said collation effectively, computer 4 rearranges the crystal database by d-values after read out then from the external memory means 7 as shown in FIG. 12(b). And said d-values stored in the internal memory of the computer 4 are collated with each rearranged d-value together with the address of the corresponding material name. In this collation, the mateial names having the same d-values stored in the internal memory of the computer 4 are listed up one by one. And it is assumed that the specimen material name is the same as the material name listed most times. In the embodiment shown in FIG. 3, the material name listed up times is displayed on the screen of the CRT 10 as shown in FIG. 13(a). Furthermore, it is more preferable that all material names listed in said collation process are displayed together with the number of times they were listed (or proportion (%) of listed times to the total number of times) on the screen of the CRT 10 as shown in FIG. 13(b).

After identifying the specimen material at step F, the computer 4 reads out the relation between the d-values and Miller indices from the crystal database stored in the external memory means 7, and refers to the relation so as to determine the Miller indices of each d-value. Furthermore, the computer 4 calculates the reciprocal lattice vector on the basis of the Miller indices of each d-value, and determines the orientation of the specimen on the basis of the reciprocal lattic vector.

Having thus described the invention with the details and particularity required by the Patent Laws, what is desired protected by Letters Patent is set forth in the following claims.

I claim:

1. Method for automatic analysis of an electron beam diffraction pattern obtained by a transmission type electron microscope comprising:
   (a) a step for capturing said electron beam diffraction pattern as a two dimensional array of digitized intensity values, each element in the array having a value Uxy;
   (b) a step for building a frequency distribution of intensity values from said two dimensional array;
   (c) a step for deciding whether said diffraction pattern is composed of only diffraction spots, only diffraction rings, or both diffraction spots and rings, on the basis of said frequency distribution of intensity values;
   (d) a step for accumulating lattice spacing d-values corresponding to each diffraction spot or ring appearing in said diffraction pattern from the two dimensional array by an algorithm selected on the basis of the result of said step (c); and
   (e) a step for determining the specimen material corresponding to said electron diffraction pattern by collating said lattice spacing d-values determining in step (d) with the d-values of the various materials in a crystal database.

2. Method for automatic analysis of electron diffraction pattern according to claim 1, wherein said step (c) comprising:
   (c-1) a step for calculating the weighted average $\bar{I}$ indicated by the following equation of $\bar{I} = \{ H(I) \cdot I \} / \{ H(I) \},$ (c-2) a step for calculating the value $\delta$ indicated by the following equation of $\delta = H(I) \cdot (I - \bar{I})^2,$ and (c-3) a step for deciding whether said diffraction pattern is composed of only diffraction spots, only diffraction rings, or both diffraction spots and rings, by comparing the value $\delta$ with two reference values.

3. Method for automatic analysis of electron diffraction pattern according to claim 1, wherein said step (d) comprises in the case of a determination in step (c) that the diffraction pattern is composed of only diffraction spots
   (d-11) a step for classifying each Uxy into a black or white level,
   (d-12) a step for determining the coordinate (u, v) of the center spot corresponding to the group having the most number of the white level pixels,
   (d-13) a step for determining the center coordinate (u, v) of each group of white level pixels,
   (d-14) a step for calculating the distance "Rs" between said center coordinate (u, v) of each group of white level pixels, and
   (d-15) a step for calculating the lattice spacing d-values "Ds" corresponding to the calculated distance "Rs".

4. Method for automatic analysis of electron diffraction pattern according to claim 1, wherein said step (d) comprises in the case of a determination in step (c) that the diffraction pattern is composed of only diffraction rings.
   (d-21) a step for calculating the X-axis projection of Uxy and Y-axis projection of Uxy,
   (d-22) a step for determining the coordinate ($u_o$, $v_o$) of the center spot of the diffraction pattern by detecting the coordinates ($u_o$) and ($v_o$) at the maximum values of said X- and Y-axis projections,
   (d-23) a step for determining the coordinate (u, v) of each pixel having peak value on the passing through the center coordinate of said center spot;
   (d-24) a step for calculating the radius "Rr" between the center coordinate of the center spot and said each coordinate (u, v), and
   (d-25) a step for calculating the lattice spacing d-values "Dr" corresponding to the calculated radius "Rr".

5. Method for automatic analysis of electron diffraction pattern according to claim 1, wherein said step (d) comprises in the case of a determination in step (c) that the diffraction pattern is composed of both diffraction spots and diffraction rings
   (d-31) a step for calculating the X-axis projection of Uxy and Y-axis projection of Uxy.
   (d-32) a step for determining the coordinate ($u_o$, $v_o$) of the center sport of the diffraction pattern by detecting the coordinate ($u_o$) and ($v_o$) at the maximum value of said Y-axis projection,
   (d-33) a step for classifying each Uxy into black or white level,
   (d-34) a step for determining the center coordinate (u, v) of each group of white level pixels,
   (d-35) a step for deciding on a diffraction spot or diffraction ring for each group of white level pixels, and
   (d-36) a step for calculating the lattic spacing d-values corresponding to each group of white level pixels on the basis of the results in step (d-35).

* * * * *

UNITED STATES PATENT AND TRADEMARK OFFICE
CERTIFICATE OF CORRECTION

PATENT NO. : 4,553,030

DATED : November 12, 1985

INVENTOR(S) : Moriyasu Tokiwai et al.

It is certified that error appears in the above-identified patent and that said Letters Patent is hereby corrected as shown below:

Column 2 Line 17 - In Formula 1 - After = insert $-\sum_{I}-$.

Column 4 Line 64 - In Formula 4 - After = insert $-\sqrt{\quad}-$.

Column 5 Line 7 "valves" should read --values--.

Column 5 Line 25 After "of" insert $-\sum_{Y}-$.

Column 5 Line 26 After "of" insert $-\sum_{X}-$.

Column 6 Line 11 "Yxy" should read --Uxy--.

Column 6 Line 29 "paid" should read --rapid--.

Column 6 Line 62 "mateial" should read --material--.

Column 7 Line 15 "lattic" should read --lattice--.

UNITED STATES PATENT AND TRADEMARK OFFICE
CERTIFICATE OF CORRECTION

PATENT NO. : 4,553,030

DATED : November 12, 1985

INVENTOR(S) : Moriyasu Tokiwai et al.

It is certified that error appears in the above-identified patent and that said Letters Patent is hereby corrected as shown below:

In The Claims:

Claim 2 - Column 7 Line 53 After $\{$ (both occurrences) insert $-\sum_I-$.

Claim 2 - Column 7 Line 58 After = insert $-\sum_I-$.

Claim 4 - Column 8 Line 27 Before "Uxy" (first occurrence) insert $-\sum_Y-$.

Claim 4 - Column 8 Line 27 Before "Uxy" (second occurrence) insert $-\sum_X-$.

Claim 4 - Column 8 Line 33 Before "passing" insert —line—.

Claim 5 - Column 8 Line 47 Before "Uxy" (first occurrence) insert $-\sum_Y-$.

Claim 5 - Column 8 Line 47 Before "Uxy" (second occurrence) insert $-\sum_X-$.

UNITED STATES PATENT AND TRADEMARK OFFICE
CERTIFICATE OF CORRECTION

PATENT NO. : 4,553,030

DATED : November 12, 1985

INVENTOR(S) : Moriyasu Tokiwai et al.

It is certified that error appears in the above-identified patent and that said Letters Patent is hereby corrected as shown below:

In the Claims:

Claim 5 - Column 8 Line 49 "sport" should read --spot--.

Claim 5 - Column 8 Line 59 "lattic" should read --lattice--.

Signed and Sealed this

Eighteenth Day of February 1986

[SEAL]

Attest:

DONALD J. QUIGG

Attesting Officer

Commissioner of Patents and Trademarks